(12) United States Patent
Eyvazkhani

(10) Patent No.: US 8,917,780 B2
(45) Date of Patent: *Dec. 23, 2014

(54) METHOD, APPARATUS AND COMPUTER PROGRAM PRODUCT FOR PROVIDING IMPROVED GRAY MAPPING

(71) Applicant: Core Wireless Licensing S.a.r.l., Luxembourg (LU)

(72) Inventor: Mahbod Eyvazkhani, Palo Alto, CA (US)

(73) Assignee: Core Wireless Licensing S.A.R.L., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 13/751,682

(22) Filed: Jan. 28, 2013

(65) Prior Publication Data

US 2013/0194506 A1    Aug. 1, 2013

Related U.S. Application Data

(63) Continuation of application No. 13/347,962, filed on Jan. 11, 2012, now Pat. No. 8,363,735, which is a continuation of application No. 11/873,861, filed on Oct. 17, 2007, now Pat. No. 8,116,386.

(51) Int. Cl.
| | | |
|---|---|---|
| H04N 1/10 | (2006.01) | |
| H04N 19/186 | (2014.01) | |
| H04N 19/34 | (2014.01) | |
| H03M 13/35 | (2006.01) | |
| H04L 1/00 | (2006.01) | |
| H04N 19/30 | (2014.01) | |
| H04L 27/26 | (2006.01) | |
| H03M 13/25 | (2006.01) | |
| H04N 9/64 | (2006.01) | |
| H04L 27/36 | (2006.01) | |

(52) U.S. Cl.
CPC ......... *H04N 9/643* (2013.01); *H04N 19/00315* (2013.01); *H04N 19/00442* (2013.01); *H03M 13/35* (2013.01); *H04L 1/007* (2013.01); *H04N 19/00424* (2013.01); *H04L 27/2626* (2013.01); *H03M 13/25* (2013.01); *H04L 27/366* (2013.01)
USPC .......................................... 375/254; 714/780

(58) Field of Classification Search
USPC .......................................... 375/254; 714/780
See application file for complete search history.

(56) References Cited

U.S. PATENT DOCUMENTS

| | | | |
|---|---|---|---|
| 2006/0031737 A1 | 2/2006 | Chugg et al. | |
| 2006/0153446 A1* | 7/2006 | Oh et al. | 382/169 |
| 2007/0204205 A1 | 8/2007 | Niu et al. | |
| 2008/0012740 A1 | 1/2008 | Li et al. | |

OTHER PUBLICATIONS

L. Wei et al; "Coded modulation with unequal error protection," Communications, IEEE Transaction on Communications, Transactions Papers, vol. 41, No. 10, pp. 1439-1449, Oct. 1993.

(Continued)

*Primary Examiner* — Kevin Kim
(74) *Attorney, Agent, or Firm* — Winstead PC

(57) ABSTRACT

An apparatus for providing improved color intensity mapping may include a processor. The processor may be configured to divide color intensity value byte data into high priority portions and low priority portions distributed as constellation points in a constellation matrix and to provide separation between each of the constellation points by assigning a unique mapping code to a plurality of the constellation points.

25 Claims, 9 Drawing Sheets

(56) References Cited

OTHER PUBLICATIONS

Yoong Choon Chang; Sze Wei Lee; Komiya, R.; "A low-complexity unequal error protection of H.264/AVC video using adaptive hierarchical QAM, "Consumer Electronics, IEEE Transactions on, vol. 52, No. 4, pp. 1153-1158, Nov. 2006.

International Search Report Form PCT/ISA/210 (3 pages) and the Written Opinion of the ISA Form PCT/ISA/237 (7 pages) for International Application No. PCT/IB2008/053571, Form PCT/ISA/220 (1 page) notification mailed Jun. 25, 2009 (11 pages in total).

Morelos-Zaragoza, R.H.; Fossorier, M.P.C.; Shu Lin; Imai, H.; Multilevel coded modulation for unequal error protection and multistage decoding. I. Symmetric constellations,: IEEE Transactions on Communications, vol. 48, No. 2, pp. 204-213, Febuary 2000.

HDMI High-Definition Multimedia Interface, http://www.hdmi.org printed out Feb. 2008 (3 pages).

Calderbank, A.R.; Seshadri, N.; "Multilevel codes for unequal error protection," IEEE Transactions on on information theory, vol. 39, No. 4, pp. 1234-1248, Jul. 1993.

\* cited by examiner

METHOD, APPARATUS AND COMPUTER PROGRAM PRODUCT FOR PROVIDING IMPROVED GRAY MAPPING

FIELD OF THE INVENTION

Embodiments of the present invention relate generally to wireless multimedia data transmission technology and, more particularly, relate to a method, apparatus and computer program product for providing improved gray mapping for wireless transmission systems.

BACKGROUND OF THE INVENTION

There is currently a growing demand for high quality multimedia. The current demand for high-definition television (HDTV) is one example of this phenomenon. Accordingly, there is a corresponding demand for devices and technologies that are capable of providing high quality multimedia to users in increasing quality, while reducing reliance upon wired connections. As a result, a drive toward high quality wireless multimedia transmission techniques is underway. As a result of this drive, improved interfaces for transmitting data streams that may include, for example, all-digital audio/video capable interfaces have been developed. High-Definition Multimedia Interface (HDMI) is an example of one such interface that is growing in popularity. HDMI is capable of transmitting uncompressed streams (video/audio) over a wireless channel. As such, HDMI and other interfaces with similar capabilities are likely to be popular for use in applications such as mmWave (millimeter wave) 60 GHz systems to transmit uncompressed signals at a rate of about 2 Gb/s.

Applications like mmWave applications represent uses of the extremely high frequency (EHF) radio frequency band. Applications in this range may provide very high data rates that can be used for transmitting uncompressed data in a streaming format. However, such applications are currently most useful in relatively short range communication environments. Moreover, in order to minimize battery drain for mobile devices, there is also a desire to keep power relatively low for many such applications. The use of lower power generally results in a low signal to noise ratio (SNR) environment. At high SNR, neighboring bits can more easily be distinguished. However, at low SNRs, neighboring bits are closer together in magnitude and could more easily get mixed up or confused. This issue is important because video data, for example, generally includes a sequence of frames in which each pixel in a frame of video includes three bytes of data to provide red, green and blue (RGB) values for the pixel. This digital representation of the color of each pixel could then be more likely to include errors which may degrade signal quality in this environment.

In this regard, a standard representation of a color intensity value is an eight bit number defining an intensity value in a range between 0 and 255 (e.g., an RGB value of 128 is provided as 10000000). The standard representation is often referred to as a gray value or a gray scale value. In a particular gray value, the most significant bit (MSB) is the first bit (e.g., 1 in the example given above) and the least significant bit (LSB) is the last bit. Errors in wireless transmission are virtually inevitable. Accordingly, it may be appreciated that errors are more tolerable (e.g., may be experienced with less impact on the gray value) for bits closer to the LSB and less tolerable for bits closer to the MSB.

Bit labeling, which is also called bit mapping, is important to consider with respect to potential transmission errors. For example, after multiplexing RGB video data, certain errors may be more dominant than others. In this regard, nearest neighbor errors may be most likely to occur. Gray mapping, which is a common type of bit mapping, includes adjacent signal points having bit labels that differ in as few bits as possible (e.g., one), therefore having a Hamming distance of one. Given that the Hamming distance is typically one for conventional modulation schemes, error detection capabilities (and therefore error correction capabilities) may be limited to some extent.

Accordingly, it may be desirable to provide a mechanism to overcome at least some of the disadvantages described above.

BRIEF SUMMARY OF THE INVENTION

A method, apparatus and computer program product are therefore provided that may enable increasing the Hamming distance for neighboring modulation points with respect to conventional gray mapping. In this regard, embodiments of the present invention may provide a new bit mapping scenario which may incorporate unequal error protection (UEP) to improve bandwidth efficiency.

In one exemplary embodiment, a method for providing improved gray mapping is provided. The method may include dividing gray value data into high priority portions and low priority portions distributed as constellation points in a constellation matrix, and providing separation between each of the constellation points by assigning a unique mapping code to a plurality of the constellation points.

In another exemplary embodiment, a computer program product for providing improved gray mapping is provided. The computer program product includes at least one computer-readable storage medium having computer-readable program code portions stored therein. The computer-readable program code portions include first and second executable portions. The first executable portion is for dividing gray value data into high priority portions and low priority portions distributed as constellation points in a constellation matrix. The second executable portion is for providing separation between each of the constellation points by assigning a unique mapping code to a plurality of the constellation points.

In another exemplary embodiment, an apparatus for providing improved gray mapping is provided. The apparatus includes a processor configured to divide gray value data into high priority portions and low priority portions distributed as constellation points in a constellation matrix and to provide separation between each of the constellation points by assigning a unique mapping code to a plurality of the constellation points.

In another exemplary embodiment, an apparatus for providing improved gray mapping is provided. The apparatus includes means for dividing gray value data into high priority portions and low priority portions distributed as constellation points in a constellation matrix and means for providing separation between each of the constellation points by assigning a unique mapping code to a plurality of the constellation points.

Accordingly, embodiments of the present invention may provide a bit mapping scenario that can increase the Hamming distance for high data rate streaming data to ameliorate transmission quality while maintaining low SNR transmission in a wireless system.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF THE INVENTION

Figure 1:
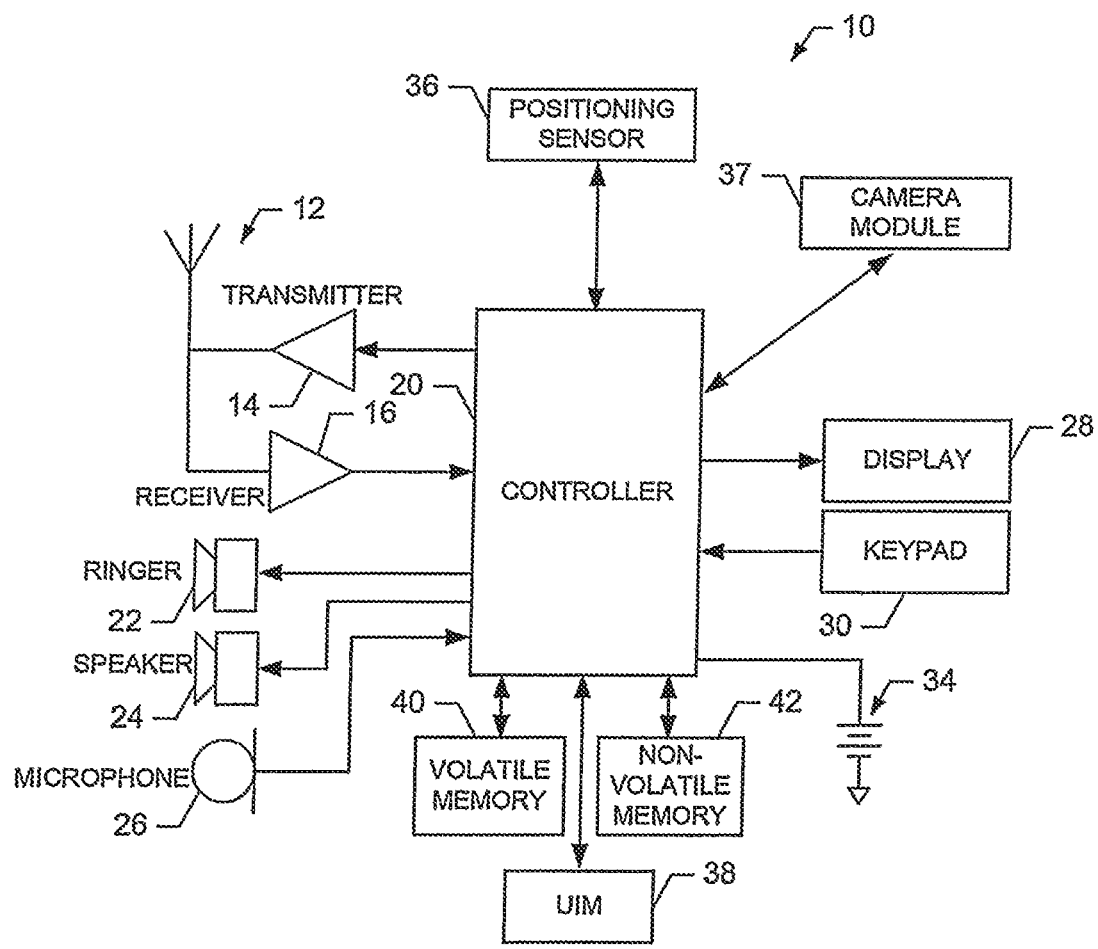
FIG. 1 is a schematic block diagram of a mobile terminal according to an exemplary embodiment of the present invention.

Embodiments of the present invention will now be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like reference numerals refer to like elements throughout.

FIG. 1, one aspect of the invention, illustrates a block diagram of a mobile terminal 10 that would benefit from embodiments of the present invention. It should be understood, however, that a mobile telephone as illustrated and hereinafter described is merely illustrative of one type of mobile terminal that would benefit from embodiments of the present invention and, therefore, should not be taken to limit the scope of embodiments of the present invention. While several embodiments of the mobile terminal 10 are illustrated and will be hereinafter described for purposes of example, other types of mobile terminals, such as portable digital assistants (PDAs), pagers, mobile televisions, gaming devices, laptop computers, cameras, video recorders, audio/video player, radio, GPS devices, or any combination of the aforementioned, and other types of voice and text communications systems, can readily employ embodiments of the present invention.

In addition, while several embodiments of the method of embodiments of the present invention are performed or used by a mobile terminal 10, the method may be employed by other than a mobile terminal (e.g., a television, personal computer (PC) or other fixed terminals or devices). Moreover, the system and method of embodiments of the present invention will be primarily described in conjunction with mobile communications applications. It should be understood, however, that the system and method of embodiments of the present invention can be utilized in conjunction with a variety of other applications, both in the mobile communications industries and outside of the mobile communications industries.

The mobile terminal 10 includes an antenna 12 (or multiple antennae) in operable communication with a transmitter 14 and a receiver 16. The mobile terminal 10 may further include an apparatus, such as a controller 20 or other processing element, that provides signals to and receives signals from the transmitter 14 and receiver 16, respectively. The signals include signaling information in accordance with the air interface standard of the applicable cellular system, and also user speech, received data and/or user generated data. In this regard, the mobile terminal 10 is capable of operating with one or more air interface standards, communication protocols, modulation types, and access types. By way of illustration, the mobile terminal 10 is capable of operating in accordance with any of a number of first, second, third and/or fourth-generation communication protocols or the like. For example, the mobile terminal 10 may be capable of operating in accordance with second-generation (2G) wireless communication protocols IS-136 (time division multiple access (TDMA)), GSM (global system for mobile communication), and IS-95 (code division multiple access (CDMA)), or with third-generation (3G) wireless communication protocols, such as Universal Mobile Telecommunications System (UMTS), CDMA2000, wideband CDMA (WCDMA) and time division-synchronous CDMA (TD-SCDMA), with fourth-generation (4G) wireless communication protocols or the like. As an alternative (or additionally), the mobile terminal 10 may be capable of operating in accordance with non-cellular communication mechanisms. For example, the mobile terminal 10 may be capable of communication in a wireless local area network (WEAN) or other communication networks described below in connection with FIG. 2.

It is understood that the apparatus, such as the controller 20, may include means such as a device or circuitry desirable for implementing audio and logic functions of the mobile terminal 10. For example, the controller 20 may be comprised of a digital signal processor device, a microprocessor device, and various analog to digital converters, digital to analog converters, and other support circuits. Control and signal processing functions of the mobile terminal 10 are allocated between these devices according to their respective capabilities. The controller 20 thus may also include the functionality to convolutionally encode and interleave message and data prior to modulation and transmission. The controller 20 can additionally include an internal voice coder, and may include an internal data modem. Further, the controller 20 may include functionality to operate one or more software programs, which may be stored in memory. For example, the controller 20 may be capable of operating a connectivity program, such as a conventional Web browser. The connectivity program may then allow the mobile terminal 10 to transmit and receive Web content, such as location-based content and/or other web page content, according to a Wireless Application Protocol (WAP), Hypertext Transfer Protocol (HTTP) and/or the like, for example.

The mobile terminal 10 may also comprise a user interface including an output device such as a conventional earphone or speaker 24, a ringer 22, a microphone 26, a display 28, and a user input interface, all of which are coupled to the controller 20. The user input interface, which allows the mobile terminal 10 to receive data, may include any of a number of devices allowing the mobile terminal 10 to receive data, such as a keypad 30, a touch display (not shown) or other input device. In embodiments including the keypad 30, the keypad 30 may include the conventional numeric (0-9) and related keys (#,

*), and other hard and soft keys used for operating the mobile terminal 10. Alternatively, the keypad 30 may include a conventional QWERTY keypad arrangement. The keypad 30 may also include various soft keys with associated functions. In addition, or alternatively, the mobile terminal 10 may include an interface device such as a joystick or other user input interface. The mobile terminal 10 further includes a battery 34, such as a vibrating battery pack, for powering various circuits that are required to operate the mobile terminal 10, as well as optionally providing mechanical vibration as a detectable output. In addition, the mobile terminal 10 may include a positioning sensor 36. The positioning sensor 36 may include, for example, a global positioning system (GPS) sensor, an assisted global positioning system (Assisted-GPS) sensor, etc. However, in one exemplary embodiment, the positioning sensor 36 includes a pedometer or inertial sensor. In this regard, the positioning sensor 36 is capable of determining a location of the mobile terminal 10, such as, for example, longitudinal and latitudinal directions of the mobile terminal 10, or a position relative to a reference point such as a destination or start point. Information from the positioning sensor 36 may then be communicated to a memory of the mobile terminal 10 or to another memory device to be stored as a position history or location information.

The mobile terminal 10 may further include a user identity module (UIM) 38. The UIM 38 is typically a memory device having a processor built in. The UIM 38 may include, for example, a subscriber identity module (SIM), a universal integrated circuit card (UICC), a universal subscriber identity module (USIM), a removable user identity module (R-UIM), etc. The UIM 38 typically stores information elements related to a mobile subscriber. In addition to the UIM 38, the mobile terminal 10 may be equipped with memory. For example, the mobile terminal 10 may include volatile memory 40, such as volatile Random Access Memory (RAM) including a cache area for the temporary storage of data. The mobile terminal 10 may also include other non-volatile memory 42, which can be embedded and/or may be removable. The non-volatile memory 42 can additionally or alternatively comprise an electrically erasable programmable read only memory (EEPROM), flash memory or the like, such as that available from the SanDisk Corporation of Sunnyvale, Calif., or Lexar Media Inc. of Fremont, Calif. The memories can store any of a number of pieces of information, and data, used by the mobile terminal 10 to implement the functions of the mobile terminal 10. For example, the memories can include an identifier, such as an international mobile equipment identification (IMEI) code, capable of uniquely identifying the mobile terminal 10. Furthermore, the memories may store instructions for determining cell id information. Specifically, the memories may store an application program for execution by the controller 20, which determines an identity of the current cell, i.e., cell id identity or cell id information, with which the mobile terminal 10 is in communication. In conjunction with the positioning sensor 36, the cell id information may be used to more accurately determine a location of the mobile terminal 10.

In an exemplary embodiment, the mobile terminal 10 includes a media capturing module, such as a camera, video and/or audio module, in communication with the controller 20. The media capturing module may be any means for capturing an image, video and/or audio for storage, display or transmission. For example, in an exemplary embodiment in which the media capturing module is a camera module 37, the camera module 37 may include a digital camera capable of forming a digital image file from a captured image, or a video file from a series of captured image frames with or without accompanying audio data. As such, the camera module 37 includes all hardware, such as a lens or other optical device, and software necessary for creating a digital image, video or audio file from captured image/audio data. Alternatively, the camera module 37 may include only the hardware needed to capture an image, while a memory device of the mobile terminal 10 stores instructions for execution by the controller 20 in the form of software necessary to create a digital image file from a captured image. In an exemplary embodiment, the camera module 37 may further include a processing element such as a co-processor which assists the controller 20 in processing image data and an encoder and/or decoder for compressing and/or decompressing image data. The encoder and/or decoder may encode and/or decode according to, for example, a joint photographic experts group (JPEG) standard or other format.

In an exemplary embodiment, the mobile terminal 10 of FIG. 1 may be in receipt of signaling comprising a data stream (e.g., a 60 GHz mmWave data stream) over a channel such as a fading channel. The data stream may include RGB data (e.g., for streamed video content) that is mapped and modulated in accordance with embodiments of the present invention. As such, the mobile terminal 10 of FIG. 1 may include elements for demodulating and decoding the data stream as provided below. However, as indicated above, the mobile terminal 10 is just one example of a device that may receive the data stream and process the data stream as provided herein. Accordingly, the mobile terminal 10 is provided by way of example and not of limitation with respect to illustrating a device that may practice embodiments of the present invention.

Figure 2:
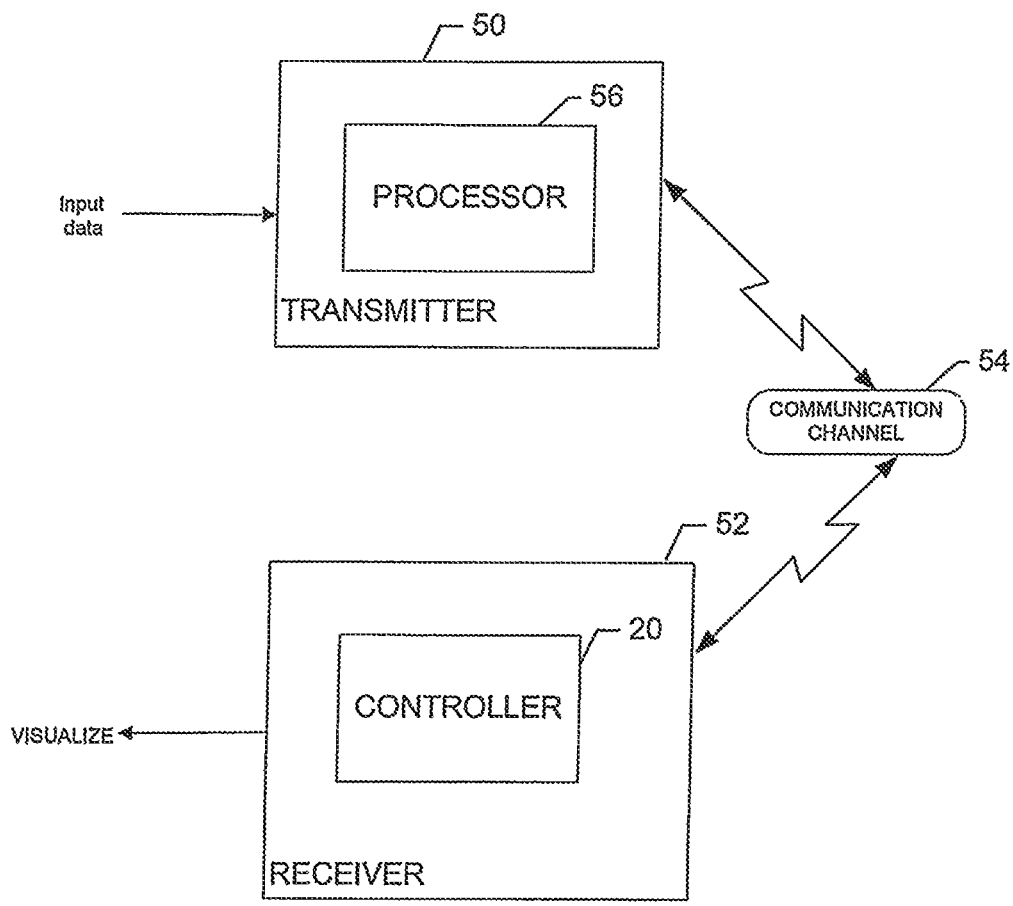
FIG. 2 is a schematic block diagram of a wireless communications system according to an exemplary embodiment of the present invention.

FIG. 2 is a schematic block diagram of a wireless communications system according to an exemplary embodiment of the present invention. Referring now to FIG. 2, an illustration of one type of system that would benefit from embodiments of the present invention is provided. The system includes, for example, a transmitter 50 and a receiver 52 in communication with each other via a communication channel 54. The communication channel 54 may be, for example, a fading channel such as a 60 GHz communication channel. The transmitter 50 may be any device or means embodied in either hardware, software, or a combination of hardware and software that is capable of transmitting data over the communication channel 54 and the receiver 52 may be any device or means embodied in either hardware, software, or a combination of hardware and software that is capable of receiving data over the communication channel 54. More specifically, the transmitter 50 may include a processor 56 or processing element configured to execute instructions for the performance of functions associated with the transmitter 50 as described in greater detail below. Meanwhile, the receiver 52 may also include a processor or processing element (e.g., the controller 20) for executing instructions for the performance of functions associated with the receiver 52 as described in greater detail below. As such, the processor 56 of the transmitter 50 and the controller 20 of the receiver 52 may control or otherwise be embodied as the elements described hereinafter in connection with the transmitter 50 and the receiver 52, respectively.

Exemplary embodiments of the present invention may enable bit mapping which may incorporate unequal error protection (UEP) to improve bandwidth efficiency and which may increase the Hamming distance for neighboring modulation points over conventional techniques. An increased Hamming distance may reduce the impact of errors that may be problematic in conventional techniques. In this regard, representing RGB values $\{0, 1, \ldots, 255\}$ with a small number of bit changes may lead to a large distortion. In this regard: $f:\{0, 1, \ldots, 255\} \rightarrow \{0, 1\}^8$ may describe the possible RGB values so that the error may be:

$$E\left[\sum_0^{255} \frac{1}{256} |f^{-1}(f(i) + \vec{e}) - i|^2\right],$$

where $\vec{e}$ is an 8 bit error pattern. Thus, a gain in picture signal to noise ration (PSNR) for a particular representation of RGB components may be achieved over the normal representation by finding a function $f$ that minimizes the E. Using a form of "Semi-Gray mapping" for calculating the PSNR of image, one may get:

$$PSNR_k = 10 \log 10 \left(\frac{255^2}{MSE}\right),$$

where mean-squared-error (MSE) for a point of picture k(i,j) is calculated as:

$$MSE_k = E\left[\sum_i \sum_j \|f(k(i, j)) - k(i, j)\|^2\right] / \text{size} - \text{of} - \text{image}.$$

Figure 3:
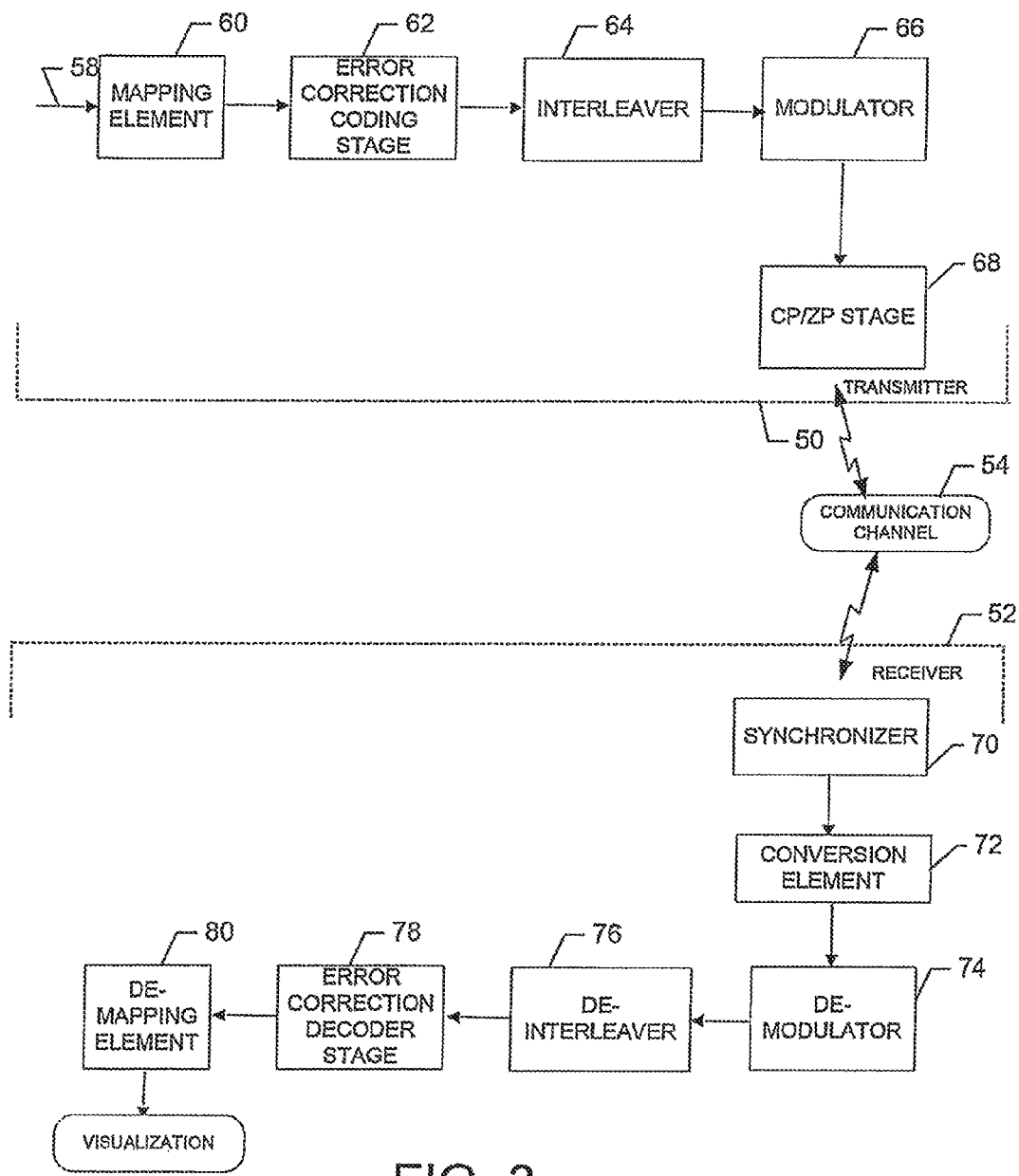
FIG. 3 is a schematic block diagram of a wireless communications system including single carrier communication for improved gray mapping according to an exemplary embodiment of the present invention.
Figure 4:
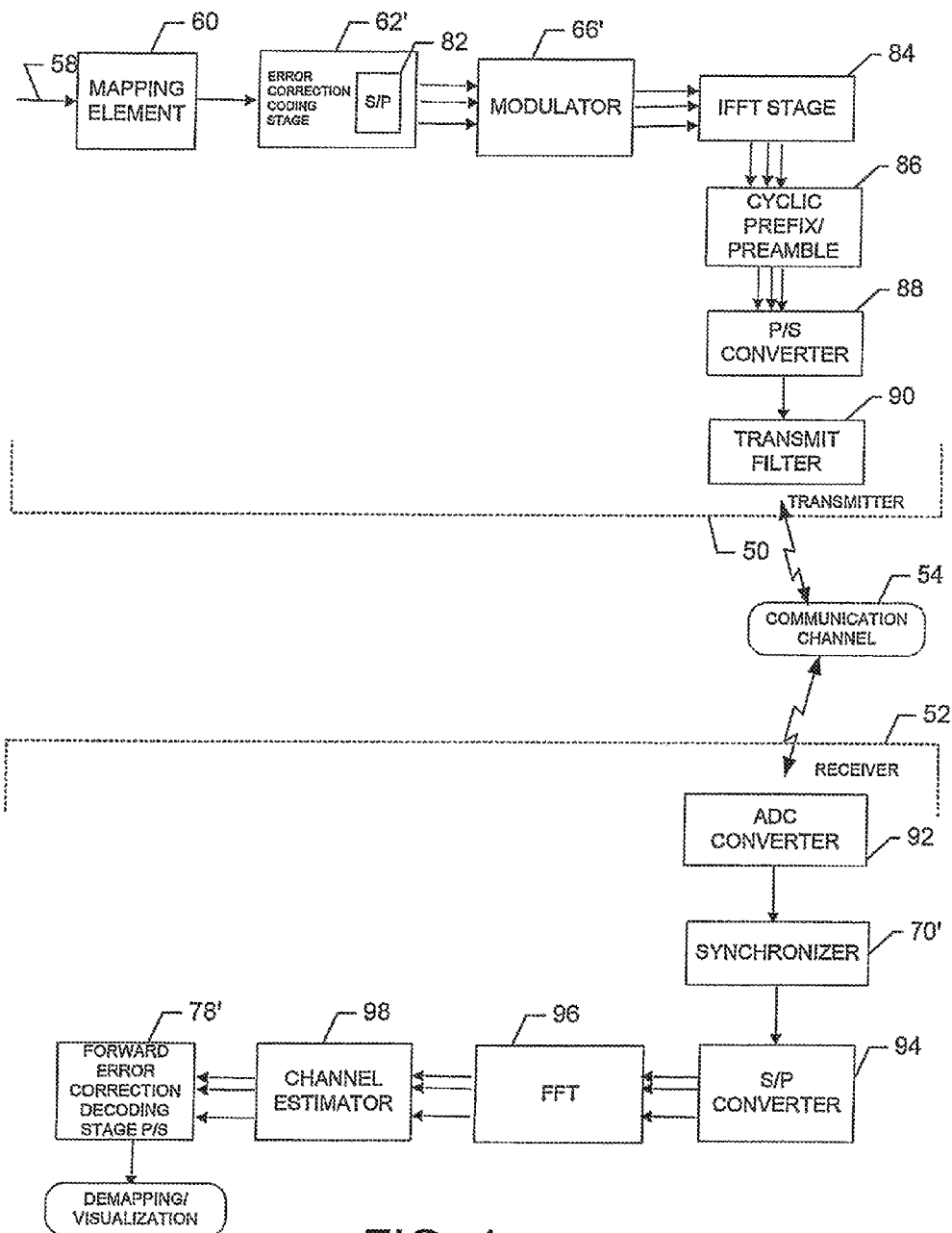
FIG. 4 is a schematic block diagram of a wireless communications system including orthogonal frequency division multiplexing (OFDM) communication for improved gray mapping according to an exemplary embodiment of the present invention.

FIG. 3 is a schematic block diagram of a wireless communications system including single carrier communication for improved gray mapping according to an exemplary embodiment of the present invention. As shown in FIG. 3, the transmitter 50 may receive video data in the form of a video input signal 58. The video input signal 58 may be mapped at a mapping element 60, which may be a portion of the transmitter 50 itself or may be a separate device in communication with the transmitter 50. The mapping element 60 may be any device or means embodied in either hardware, software, or a combination of hardware and software that is capable of mapping the video input signal 58 to a series of RGB values. It should also be noted, however, that while FIG. 3 illustrates one example of a configuration of a system for providing improved gray mapping, numerous other configurations may also be used to implement embodiments of the present invention (of which FIG. 4 is but one example).

The series of RGB values may then be communicated to an error correction coding stage 62 (e.g., a forward error correction (FEC) coder such as a low density parity check (LDPC)), which may be any device or means embodied in either hardware, software, or a combination of hardware and software that is capable of providing information for use in error detection and correction at the receiver 52. In some embodiments, the error correction coding stage 62 may be configured to provide redundant information for use in error detection and correction. The error correction coding stage 62 may provide information for interleaving at an interleaver 64, which may be optionally employed. Data output from the interleaver 64 (if employed, or data from the error correction coding stage 62 if the interleaver 64 is not employed) may then be communicated to a modulator 66. Modulation may occur at the modulator 66 in accordance with several possible modulation schemes. For example, the modulator 66 may be any device or means embodied in either hardware, software, or a combination of hardware and software that is capable of modulating input data in accordance with various modulation techniques such as, for example, quadrature amplitude modulation (QAM) such as 4-QAM, 16-QAM, 64-QAM, etc. (in which 4, 16 and 64 each refer to constellation size), or binary phase shift keying (BPSK).

An output of the modulator 66 may be communicated to a cyclic prefix and/or zero padding CP/ZP stage 68. The CP/ZP stage 68 may be any device or means embodied in either hardware, software, or a combination of hardware and software that is capable of assisting in data synchronization at the receiver 52. In this regard, for example, the CP/ZP stage 68 may include information for use in synchronizing a start of each frame to enhance or optimize data synchronization. After passing through the CP/ZP stage 68 (if employed), the modulated data may be transmitted over the communication channel 54 to the receiver 52.

The receiver 52 may initially process the received signal at a synchronizer 70. The synchronizer 70 may be any device or means embodied in either hardware, software, or a combination of hardware and software that is capable of synchronizing the received signal to enable proper demodulation/decoding of the received signal. In an exemplary embodiment, the synchronizer 70 may be configured to remove the cyclic prefix added at the CP/ZP stage 68 prior to transmission. An output of the synchronizer 70 may be communicated to a conversion element 72.

The conversion element 72 may include means such as a device or circuitry for performing a frequency domain conversion and/or equalization on the received signal. In this regard, for example, the conversion element 72 may include functionality for performing a fast Fourier transform (FFT) on the received (and synchronized) signal. An output of the conversion element 72 may be communicated to a demodulator 74. The demodulator 74 may be any device or means embodied in either hardware, software, or a combination of hardware and software that is capable of demodulating input data based on a predetermined demodulation scheme. If the interleaves 64 was employed in the transmitter 50, the receiver 52 may include a de-interleaves 76 to de-interleave an output from the demodulator 74. An output of the de-interleaver 76 may then be communicated to an error correction decoder stage 78.

The error correction decoder stage 78 may be any device or means embodied in either hardware, software, or a combination of hardware and software that is configured to perform error detection and correction based on the information provided by the error correction encoder stage 62. An output of the error correction decoder stage 78 may be communicated to a de-mapping element 80 in order to de-map the RGB values for visualization (e.g., at the display 28).

FIG. 4 is a schematic block diagram of a wireless communications system including orthogonal frequency division multiplexing (OFDM) communication for improved gray mapping according to an exemplary embodiment of the present invention. As shown in FIG. 4, the transmitter 50 may receive video data in the form of a video input signal 58. The video input signal 58 may be mapped at the mapping element 60, which may be configured to map the video input signal 58 to a series of RGB values.

The series of RGB values may then be communicated to an error correction coding stage 62', which may include a serial-to-parallel converter 82 for converting serial RGB value data into parallel RGB value data. The error correction coding stage 62' may then provide parallel data to a modulator 66'. Modulation may occur at the modulator 66' in accordance with several possible modulation schemes, which could include adaptive modulation coding. An IFFT stage 84 may be included to convert data from the frequency domain into the time domain. The IFFT stage 84 may also be configured to provide for the insertion of pilot tones, if desired. An output of the IFFT stage 84 may be communicated to a cyclic prefix/preamble stage 86 that may be configured to provide cyclic prefix or preamble data that may be used as a training sequence for use in synchronization and/or equalization at the receiver 52. A parallel-to-serial converter 88 may then be used to convert the output of the IFFT stage 84 into a serial signal for communication to a transmit filter 90. The transmit filter 90 may include filtering functionality as well as, for example, a predistorter and/or digital-to-analog (DAC) converter for converting the serial signal to an analog signal for transmission over the communication channel 54.

At the receiver 52, the received data may be converted back to digital data by an analog-to-digital (ADC) converter 92. The output of the ADC converter 92 may be any device or means embodied in either hardware, software, or a combination of hardware and software that is configured to communicated to a synchronizer 70', which may be configured to synchronize the received data for further processing. A CP element 94 may be configured to remove the cyclic prefix and to convert the serial data output from the synchronizer 70' to parallel data with a serial-to-parallel converter 96. The parallel data may then be converted back to the frequency domain by an FFT element 98. A channel estimator 100 in communication with the FFT element 98 may then estimate channel conditions prior to communicating data received at the channel estimator 100 to a demodulator 74', which may be configured to demodulate the data received thereat. Demodulated data may then be communicated to an error correction decoding stage 78', which may also convert parallel data to a serial output for RGB value demapping and ultimately for visualization (e.g., at the display 28).

Figure 5:
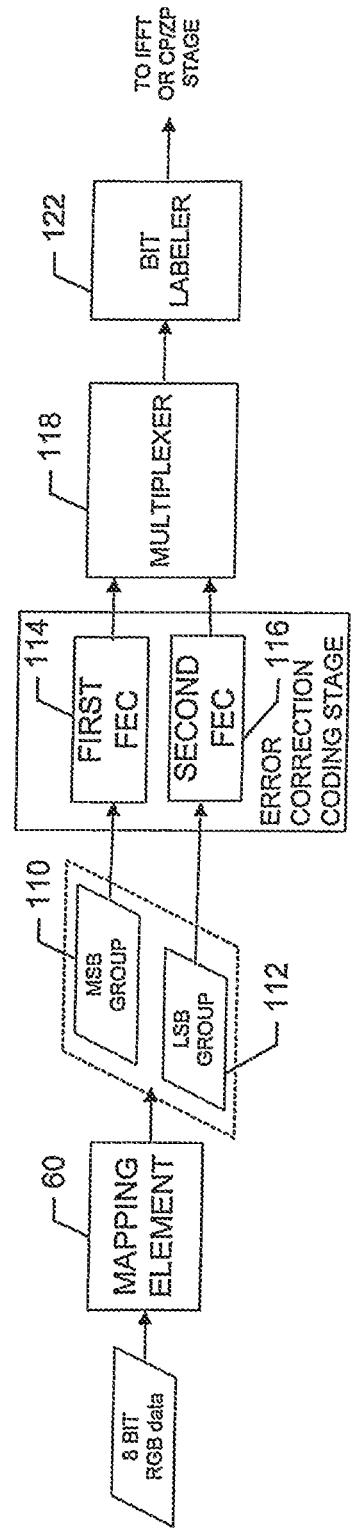
FIG. 5 is a schematic block diagram illustrating a more detailed view of certain elements of FIGS. 3 and 4.

FIG. 5 illustrates a more detailed view of certain elements of FIGS. 3 and 4. In this regard, FIG. 5 illustrates elements of the transmitter 50 up to the modulator 66 (or 66'). As indicated in FIG. 5, data output from the mapping element 60 may be broken into high priority data and low priority data portions. In an exemplary embodiment, the processor 56 may perform the separation of the RGB values into an MSB group 110 (e.g., the four most significant bits of a particular byte of RGB data) corresponding to the high priority data and an LSB group 112 (e.g., the four least significant bits of the particular byte) corresponding to the low priority data. However, it should be noted that the division of the MSB group 110 and the LSB 112 group need not be an equal division (four bits each), but could instead be performed on a different basis. Furthermore, as illustrated in FIG. 5, the error correction coding stage 62 (or 62') may further include a first FEC 114 configured to receive the MSB group 110 and a second FEC 116 configured to receive the LSB group 112. In an exemplary embodiment, since errors in the MSB group 110 are likely to have a greater impact on distortion of the visualized output (e.g., at the display 28), the first FEC 114 may be configured to be a stronger FEC than the second FEC 116. In this regard, the first FEC 114 may be more complex than the second FEC 116 with regard to increased error detection and/or correction capabilities (e.g., more redundant information for use in error correction/detection as compared to the second FEC 116).

An output of the first and second FECs 114 and 116 may then be multiplexed at a multiplexer 118, which may form a portion of the error correction coding stage 62 (or 62') or the modulator 66 (or 66'). The multiplexer 118 may be any suitable multiplexer known in the art. An output of the multiplexer 118 may then be communicated to a bit labeler 120, which may form a portion of the modulator 66 (or 66'). In an exemplary embodiment, the bit labeler 120 may be any device or means embodied in either hardware, software, or a combination of hardware and software that is configured to provide separation between constellation points of a constellation matrix as described in greater detail below thereby increasing the Hamming distance between data to be transmitted to provide improved quality such as for low SNR applications (e.g., like the 60 GHz transmission scheme described above). The bit labeler 120 may be controlled or otherwise embodied by the processor 56.

Figure 6:
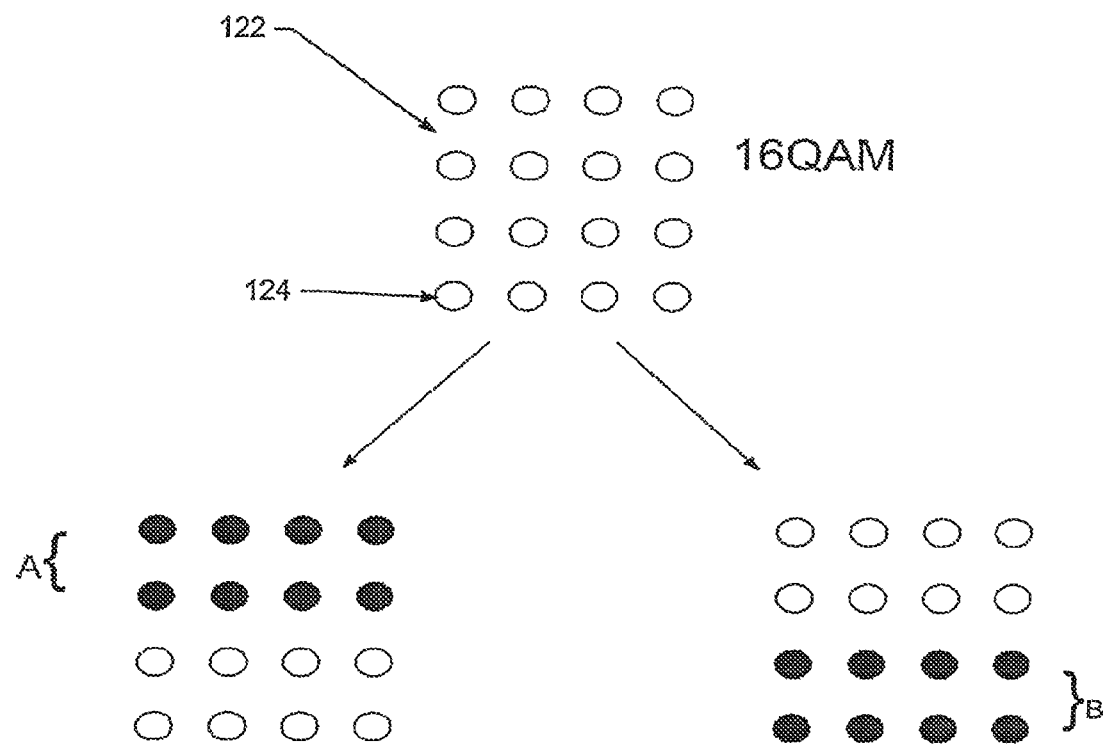
FIG. 6 illustrates a constellation matrix being processed in accordance with an exemplary embodiment of the present invention.

In an exemplary embodiment, the bit labeler 120 may be configured to assign a code mapping to constellation points of a constellation matrix 122. In this regard, the constellation matrix 122 (see FIG. 6) may be comprised of a plurality of four bit constellation points which, for example, for 16-QAM include sixteen constellation points 124 that may be arranged in a 4×4 matrix as indicated in FIG. 6. Each of the constellation points 124 may represent a symbol or element to be communicated across the communication channel 54. In this regard, for example, each constellation point 124 may represent one of the MSB group 110 or LSB group 112 for data split prior to processing by the first and second FECs 114 and 116. The bit labeler 120 may initially split the constellation matrix 122 into two data sets of equal size. In FIG. 6, the bit labeler 120 splits the constellation matrix 122 into an upper set A and a lower set B. However, the sets could be split in an alternative fashion (e.g., right and left). The bit labeler 120 may apply a prefix bit to each of the sets (A and B) to differentiate therebetween. In an exemplary embodiment, the upper set A may be given a prefix bit of 0 and the lower set B may be given a prefix bit of 1.

Figure 7:
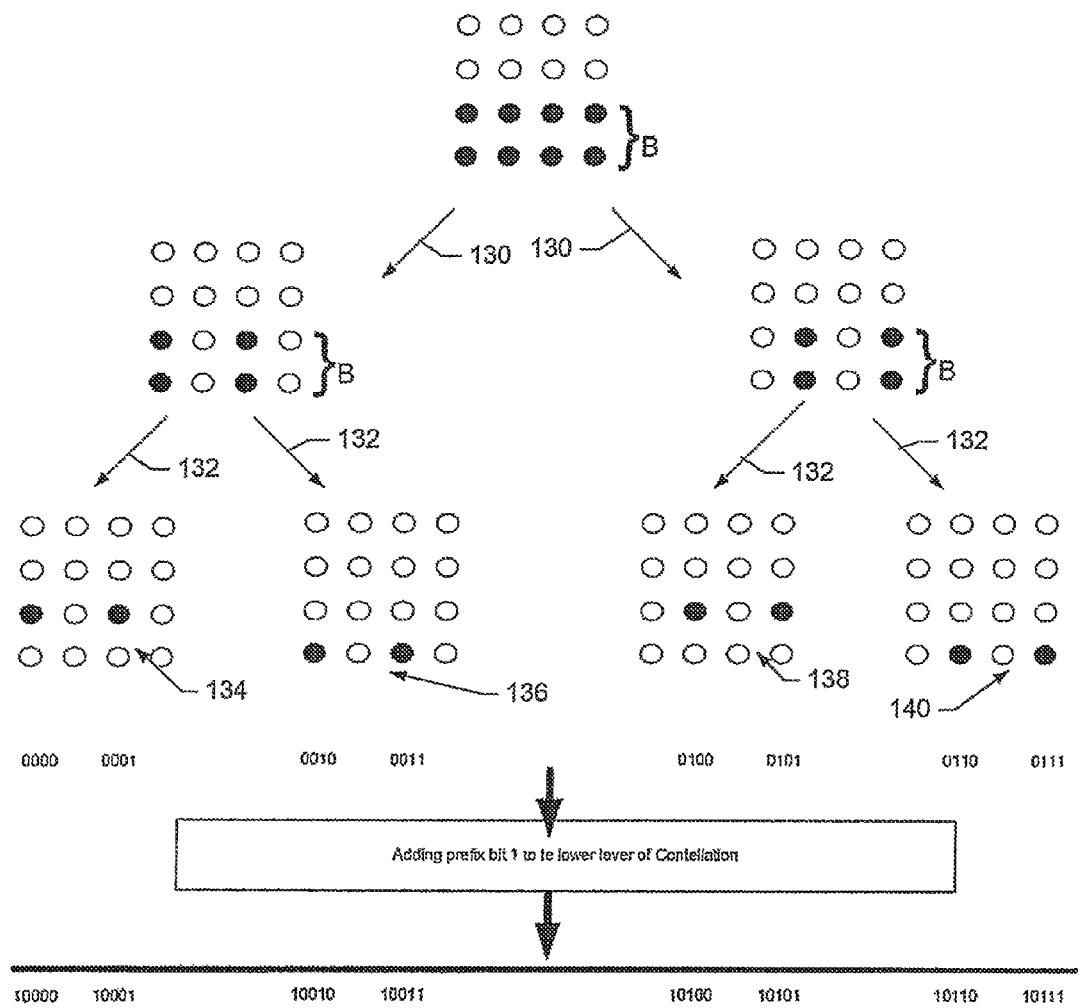
FIG. 7 illustrates a portion of the constellation matrix being further processed in accordance with an exemplary embodiment of the present invention.

FIG. 6, which illustrates a constellation matrix being processed in accordance with embodiments of the present invention, shows the division of a 16-QAM constellation matrix into the lower set B (in which members of the lower set B are illustrated by the filled in circles corresponding thereto) and the upper set A (in which members of the upper set A are illustrated by the filled in circles corresponding thereto). FIG. 7 further illustrates further separation of constellation points within only the lower set B, although the further separation of constellation points within the upper set A is performed in a similar manner. As shown in FIG. 7, neighboring constellation points undergo an initial separation operation (e.g., at operation 130), which separates neighboring constellation points along a first direction (in this case horizontal) into separate groups. Then in an additional operation (e.g., operation 132), neighboring constellation points along a second direction (in this case vertical) are further separated. Accordingly, in the groupings of constellation points that remain, a greater spacing between the constellation points is provided. The constellation points within each of the groupings (e.g., grouping one 134, grouping two 136, grouping three 138 and grouping four 140) may be assigned a code mapping value that defines a position of the corresponding constellation point. Thus, when considered together with the prefix bit, the code mapping values may provide a unique mapping code for each position within the constellation matrix 122 that can then be used at the corresponding decoder in order to reconstruct the constellation matrix 122. However, since the neighboring constellation points were further separated by the mechanism described above, a higher Hamming distance is provided between neighboring constellation points and thus, error detection and/or correction may be enhanced even at lower powers and/or SNR values. For higher constellation schemes (e.g., 64-QAM and 256-QAM) even higher Hamming distances (e.g., 3 or higher) may be achieved to enhance wireless transmission performance.

As illustrated in FIG. 7, a constellation point in the upper left corner of the lower set B may have a unique mapping code of 10000. In this regard, the prefix bit (1) may indicate that the constellation point is in the lower set B, while the code 0000 indicates that the constellation point is the upper left-most constellation point in the lower set B. Meanwhile, a constellation point in the lower left corner of the lower set B may have a unique mapping code of 10010. Again the prefix bit (1) indicates that the constellation point is in the lower set B, while the code 0010 indicates that the constellation point is the lower left-most constellation point in the lower set B. Given that each constellation point has a unique mapping code, the separation inserted by the bit labeler 120 in the modulation stage may enable decoding at the receiver 52 for reconstruction of the constellation matrix 122.

Figure 8:
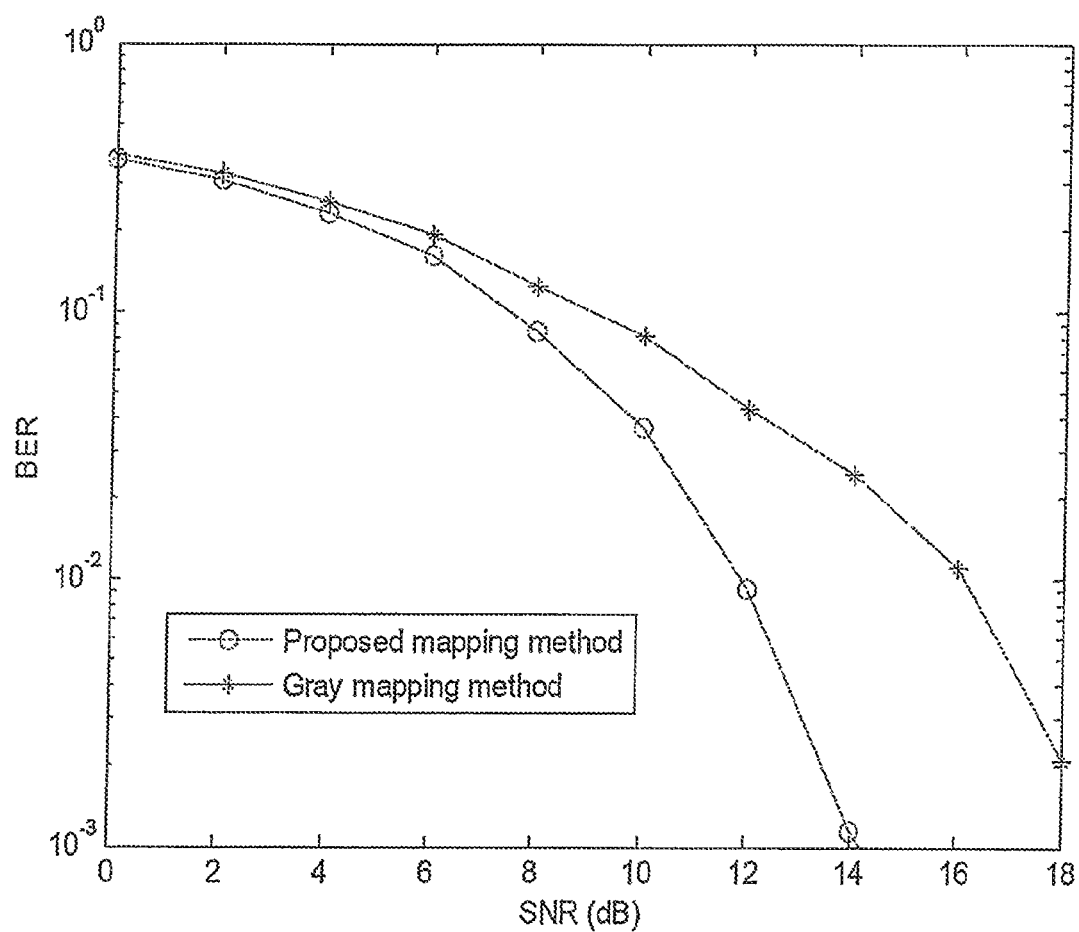
FIG. 8 illustrates a chart showing advantages in bit error rate (BER) that were achieved in accordance with one exemplary embodiment of the present invention.

FIG. 8 illustrates a chart illustrating advantages in bit error rate (BER) that were achieved by an embodiment of the present invention (illustrated by the plotted circle shapes) over a conventional gray mapping method (illustrated by the plotted asterisk shapes). In this regard, as indicated above, embodiments of the present invention may be useful in the context of extremely high frequency applications. For example, when used in connection with a mmWave (60 GHz) application where relatively high data rates of about 2 Gb/s are achievable, video signals (e.g., in HDMI format) could be transmitted in a non-compressed manner. A common challenge for designing a high data rate (e.g., 60-GHz) system is the limited link budget due to high path loss during radio propagation. For a fixed separation between transmitter and receiver, the propagation loss at 60 GHz may be, for example, about 30 dB higher than at 2 GHz in free space. Accordingly, it may be preferable to employ schemes which could increase the Hamming distance and consequently ameliorate the PSNR and the SNR of wireless link transmission, as described above in connection with embodiments of the present invention. FIG. 8 shows that embodiments of the present invention may be capable of providing more than 3 dB increases in SNR, which could offer a much improved quality by overcoming the phenomena of high path loss. Accordingly, picture quality may be maintained during transmission, even for a video signal in a non-compressed mode that is vulnerable to noise. Embodiments of the present invention may also be useful in connection with other applications such as, for example, 802.11n and WiMAX.

Figure 9:
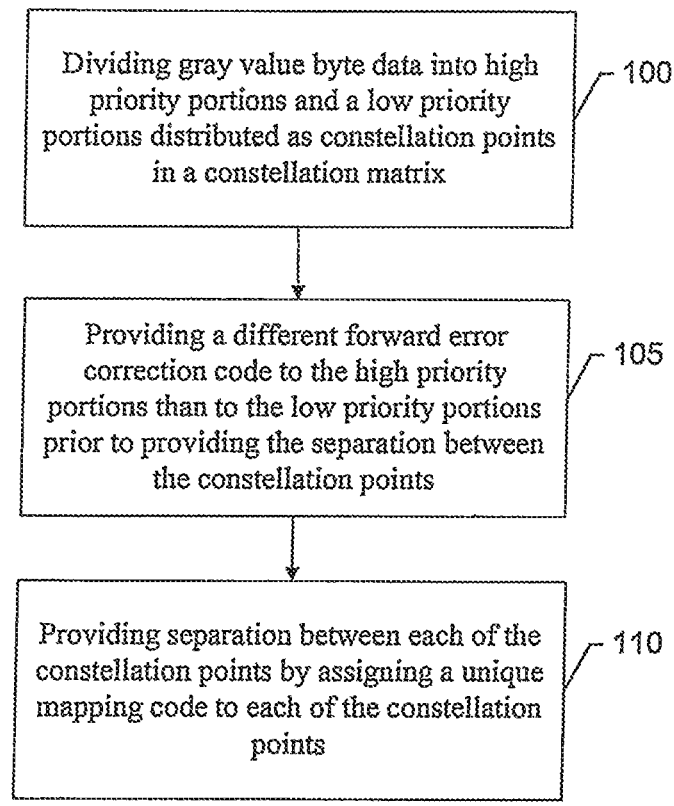
FIG. 9 is a block diagram according to an exemplary method of providing improved gray mapping according to an exemplary embodiment of the present invention.

FIG. 9 is a flowchart of a method and program product according to exemplary embodiments of the invention. It will be understood that each block or step of the flowcharts, and combinations of blocks in the flowcharts, can be implemented by various means, such as hardware, firmware, and/or software including one or more computer program instructions. For example, one or more of the procedures described above may be embodied by computer program instructions. In this regard, the computer program instructions which embody the procedures described above may be stored by a memory device of the mobile terminal and executed by a built-in processor in the mobile terminal. As will be appreciated, any such computer program instructions may be loaded onto a computer or other programmable apparatus (i.e., hardware) to produce a machine, such that the instructions which execute on the computer or other programmable apparatus create means for implementing the functions specified in the flowcharts block(s) or step(s). These computer program instructions may also be stored in a computer-readable memory that can direct a computer or other programmable apparatus to function in a particular manner, such that the instructions stored in the computer-readable memory produce an article of manufacture including instruction means which implement the function specified in the flowcharts block(s) or step(s). The computer program instructions may also be loaded onto a computer or other programmable apparatus to cause a series of operational steps to be performed on the computer or other programmable apparatus to produce a computer-implemented process such that the instructions which execute on the computer or other programmable apparatus provide steps for implementing the functions specified in the flowcharts block(s) or step(s).

Accordingly, blocks or steps of the flowcharts support combinations of means for performing the specified functions, combinations of steps for performing the specified functions and program instruction means for performing the specified functions. It will also be understood that one or more blocks or steps of the flowcharts, and combinations of blocks or steps in the flowcharts, can be implemented by special purpose hardware-based computer systems which perform the specified functions or steps, or combinations of special purpose hardware and computer instructions.

In this regard, one embodiment of a method for providing improved gray mapping, as shown in FIG. 9, may include dividing gray value byte data into high priority portions and low priority portions distributed as constellation points in a constellation matrix at operation 100. At operation 110, separation may be provided between each of the constellation points by assigning a unique mapping code to each (or just a plurality) of the constellation points. In an exemplary embodiment, an optional operation 105 may be performed prior to operation 110. In this regard, operation 105 may include providing a different forward error correction code to the high priority portions than to the low priority portions prior to providing the separation between the constellation points. In an exemplary embodiment, a forward error correction code applied to the high priority portions may be stronger than the forward error correction code applied to the low priority portions.

In an exemplary embodiment, dividing the gray value byte data may include dividing each gray value byte into a high priority portion corresponding to most significant bits of the gray value byte and a low priority portion corresponding to the least significant bits of the gray value byte. In another exemplary embodiment, providing separation may include dividing the constellation matrix into halves. A prefix portion of the mapping code (e.g., bit prefix) may be applied to differentiate each of the halves of the constellation matrix. Neighboring constellation points within each of the halves of the constellation matrix may be sequentially separated and each of the constellation points may be assigned an identifier indicative of the position of each corresponding one of the constellation points within each of the halves within a corresponding one of the halves. In an exemplary embodiment, sequentially numbered identifiers may be applied to non-neighbor constellation points based on a sequence determined by the sequential separating operation above.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A method comprising:
   dividing color intensity value data into high priority portions and low priority portions distributed as constellation points in a constellation matrix using one or more processors, the color intensity value data being included in a media signal being processed by the one or more processors prior to transmission to a receiver; and
   providing separation between each of the constellation points by assigning a mapping code to a plurality of the constellation points.

2. The method of claim 1, further comprising providing a different forward error correction code to the high priority portions than to the low priority portions prior to providing the separation between the constellation points.

3. The method of claim 2, wherein providing the different forward error correction code comprises applying a stronger forward error correction code to the high priority portions than the forward error correction code applied to the low priority portions.

4. The method of claim 1, wherein dividing the color intensity value byte data comprises dividing each color intensity value byte into a high priority portion corresponding to the most significant bits of the color intensity value byte and a low priority portion corresponding to the least significant bits of the color intensity value byte.

5. The method of claim 1, wherein providing separation comprises dividing the constellation matrix into portions.

6. The method of claim 5, further comprising assigning a prefix portion of the mapping code to differentiate each of the portions of the constellation matrix.

7. The method of claim 6, further comprising sequentially separating neighboring constellation points within each of the portions of the constellation matrix and assigning each of the constellation points an identifier indicative of a position of each of the constellation points within each of the portions within a corresponding one of the portions.

8. The method of claim 7, wherein assigning each of the constellation points the identifier comprises applying sequentially numbered identifiers to non-neighbor constellation points based on a sequence determined by the sequentially separating.

9. A computer program product comprising at least one non-transitory computer-readable storage medium having computer-readable program code portions stored therein, the computer-readable program code portions comprising:
   a first executable portion for dividing color intensity value data into high priority portions and low priority portions distributed as constellation points in a constellation matrix using one or more processors, the color intensity value data being included in a media signal being processed by the one or more processors prior to transmission to a receiver; and
   a second executable portion for providing separation between each of the constellation points by assigning a mapping code to a plurality of the constellation points.

10. The computer program product of claim 9, further comprising a third executable portion for providing a different forward error correction code to the high priority portions than to the low priority portions prior to providing the separation between the constellation points.

11. The computer program product of claim 10, wherein the third executable portion includes instructions for applying a stronger forward error correction code to the high priority portions than the forward error correction code applied to the low priority portions.

12. The computer program product of claim 9, wherein the first executable portion includes instructions for dividing each color intensity value byte into a high priority portion corresponding to the most significant bits of the color intensity value byte and a low priority portion corresponding to the least significant bits of the color intensity value byte.

13. The computer program product of claim 9, wherein the second executable portion includes instructions for dividing the constellation matrix into portions.

14. The computer program product of claim 13, wherein the second executable portion includes instructions for assigning a prefix portion of the mapping code to differentiate each of the portions of the constellation matrix.

15. The computer program product of claim 14, wherein the second executable portion includes instructions for sequentially separating neighboring constellation points within each of the portions of the constellation matrix and assigning each of the constellation points an identifier indicative of a position of each of the constellation points within each of the portions within a corresponding one of the portions.

16. The computer program product of claim 15, wherein the second executable portion includes instructions for applying sequentially numbered identifiers to non-neighbor constellation points based on a sequence determined by the sequentially separating.

17. An apparatus comprising one or more processors and memory including computer program code, the memory and computer program code configured to, with the one or more processors, cause the apparatus to:
   divide color intensity value data into high priority portions and low priority portions distributed as constellation points in a constellation matrix, the color intensity value data being included in a media signal being processed by the one or more processors prior to transmission to a receiver; and
   provide separation between each of the constellation points by assigning a mapping code to each of the constellation points.

18. The apparatus of claim 17, wherein the memory and computer program code are further configured to, with the one or more processors, cause the apparatus to provide a different forward error correction code to the high priority portions than to the low priority portions prior to providing the separation between the constellation points.

19. The apparatus of claim 18, wherein the memory and computer program code are further configured to, with the one or more processors, cause the apparatus to apply a stronger forward error correction code to the high priority portions than the forward error correction code applied to the low priority portions.

20. The apparatus of claim 17, wherein the memory and computer program code are further configured to, with the one or more processors, cause the apparatus to divide each color intensity value byte into a high priority portion corresponding to the most significant bits of the color intensity value byte and a low priority portion corresponding to the least significant bits of the color intensity value byte.

21. The apparatus of claim 17, wherein the memory and computer program code are further configured to, with the one or more processors, cause the apparatus to divide the constellation matrix into portions.

22. The apparatus of claim 21, wherein the memory and computer program code are further configured to, with the one or more processors, cause the apparatus to assign a prefix portion of the mapping code to differentiate each of the portions of the constellation matrix.

23. The apparatus of claim 22, wherein the memory and computer program code are further configured to, with the one or more processors, cause the apparatus to sequentially separate neighboring constellation points within each of the portions of the constellation matrix and assign each of the constellation points an identifier indicative of a position of each of the constellation points within each of the portions within a corresponding one of the portions.

24. The apparatus of claim 23, wherein the memory and computer program code are further configured to, with the one or more processors, cause the apparatus to apply sequentially numbered identifiers to non-neighbor constellation points based on a sequence determined by the sequentially separating.

25. An apparatus comprising:
- means for dividing color intensity value data into high priority portions and low priority portions distributed as constellation points in a constellation matrix, the color intensity value data being included in a media signal being processed by one or more processors prior to transmission to a receiver; and
- means for providing separation between each of the constellation points by assigning a mapping code to each of the constellation points.

* * * * *